United States Patent [19]

Lee et al.

[11] Patent Number: 5,008,905

[45] Date of Patent: Apr. 16, 1991

[54] UNIVERSAL SHIFT REGISTER EMPLOYING A MATRIX OF TRANSMISSION GATES

[75] Inventors: Alfred Lee, Torrance; Daniel T. Kain, Hermosa Beach, both of Calif.

[73] Assignee: Hughes Aircraft Company, Los Angeles, Calif.

[21] Appl. No.: 208,692

[22] Filed: Jun. 20, 1988

[51] Int. Cl.[5] .................... G11C 19/00; H03K 21/02; H03K 23/50

[52] U.S. Cl. ........................................ 377/77; 377/69; 377/70; 377/111; 377/114; 377/115

[58] Field of Search ................. 377/64, 67, 69, 70, 377/73, 77, 79, 80, 81, 110, 111, 119, 115–117; 307/272.1, 272.2; 340/825.68; 364/715.08

[56] References Cited

U.S. PATENT DOCUMENTS

| | | | |
|---|---|---|---|
| 3,943,378 | 3/1976 | Beutler | 377/117 |
| 3,972,034 | 7/1976 | Derickson | 377/67 |
| 4,258,273 | 3/1981 | Straznicky et al. | 377/81 |
| 4,379,222 | 4/1983 | Hayter et al. | 377/81 |
| 4,387,341 | 6/1983 | Martinson | 377/73 |
| 4,516,251 | 5/1985 | Gallup | 377/110 |
| 4,648,105 | 3/1987 | Priebe et al. | 377/64 |
| 4,651,333 | 3/1987 | Cappon | 377/77 |
| 4,665,538 | 5/1987 | Machida | 377/70 |
| 4,686,691 | 8/1987 | Deal et al. | 377/70 |
| 4,827,441 | 8/1989 | Someshawar et al. | 377/64 |
| 4,850,000 | 7/1989 | Dias | 377/77 |

FOREIGN PATENT DOCUMENTS

| | | | |
|---|---|---|---|
| 0031638 | 7/1981 | European Pat. Off. | 377/73 |
| 0037934 | 3/1982 | Japan | 377/73 |

OTHER PUBLICATIONS

Nakayama et al.–A GaAs Data Switching IC for a Gigabits per Second Communication System–IEEE Journal of Solid–State Circuits–vol. SC. 21–No. 1–Feb. 1986–pp. 157–161.

Primary Examiner—John S. Heyman
Assistant Examiner—Tai V. Duong
Attorney, Agent, or Firm—William J. Streeter; Wanda K. Denson-Low

[57] ABSTRACT

A universal shift register (200) utilizes a matrix (236–251) of high speed transmission gates to effect the various modes of register data manipulation in place of conventional operating mode selection logic gate elements. The shift register additionally includes apparatus allowing for the cascading of the register with units of similar design.

9 Claims, 3 Drawing Sheets

UNIVERSAL SHIFT REGISTER EMPLOYING A MATRIX OF TRANSMISSION GATES

This invention was made with Government support under contract N66001-86-C-0271 awarded by the Department of the Navy. The Government has certain rights in this invention.

BACKGROUND OF THE INVENTION

The invention relates generally to universal shift registers. More specifically, the invention concerns high speed shift registers with a plurality of selectable operating modes implemented by an array of high speed transmission gates.

Conventional "universal shift registers" provide a plurality of different and individually selectable operating modes, including, for example, parallel input, shift-right, shift-left, and hold, each mode selected in accordance with a user-selectable code input to the register via a decoder associated with the universal shift register. To effect the various operating modes, conventional universal shift registers have utilized combinatorial logic gates to direct data among the register stages and into and out of the register in accordance with the desired register operating mode. Use of such conventional shift register operating mode logic leads to disadvantages including increased propagation delay, complex random layouts for integrated circuit implementation, long interconnect line lengths between components adding to propagation delay and reduced testability and increased probability of deleterious race conditions.

Digital transmission gate switch matrixes for high speed data systems are known. See, for example, *A GaAs Data Switching IC for a Gigabits Per Second Communication System*, Nakayama et al., IEEE Journal of Solid State Circuits, Vol. SC-21, Number 1, Feb. 1986. However, use of such matrices in implementing various modes of shift register operation is believed heretofore unknown.

SUMMARY OF THE INVENTION

It is an object of the invention to provide a universal shift register capable of operating at improved speeds.

A universal shift register has a plurality of selectable operating modes. The shift register includes a plurality of bistable storage devices, one for each stage of the shift register. User programmable inputs indicate which one of the plurality of selectable operating modes are to be used, and a matrix of information transmission gates coupled to the indicating source and to the plurality of bistable storage devices is arranged such that register stage data is manipulated in accordance with an indicated shift register operating mode.

It is a feature of the invention that the propagation delay of the shift register designed in accordance therewith is reduced, in that the propagation delay can be traced to but a single switching gate.

It is another feature of the invention that it significantly improves an integrated ciruit chip's density by simplification of the required overall layout complexity.

It is yet a further feature of the invention that it reduces interconnect line lengths among elements of the universal shift register resulting in a further reduction in propagation delay due to a reduction in parasitic capacitance.

It is still a further feature of the invention that it increases the testability of the shift register device by removing conventional gated mode implementation logic.

BRIEF DESCRIPTION OF THE DRAWINGS

These and other objects and features of the invention will become apparent from a reading of the detailed description of an illustrative embodiment in conjunction with the drawings, in which.

DETAILED DESCRIPTION

Figure 1:
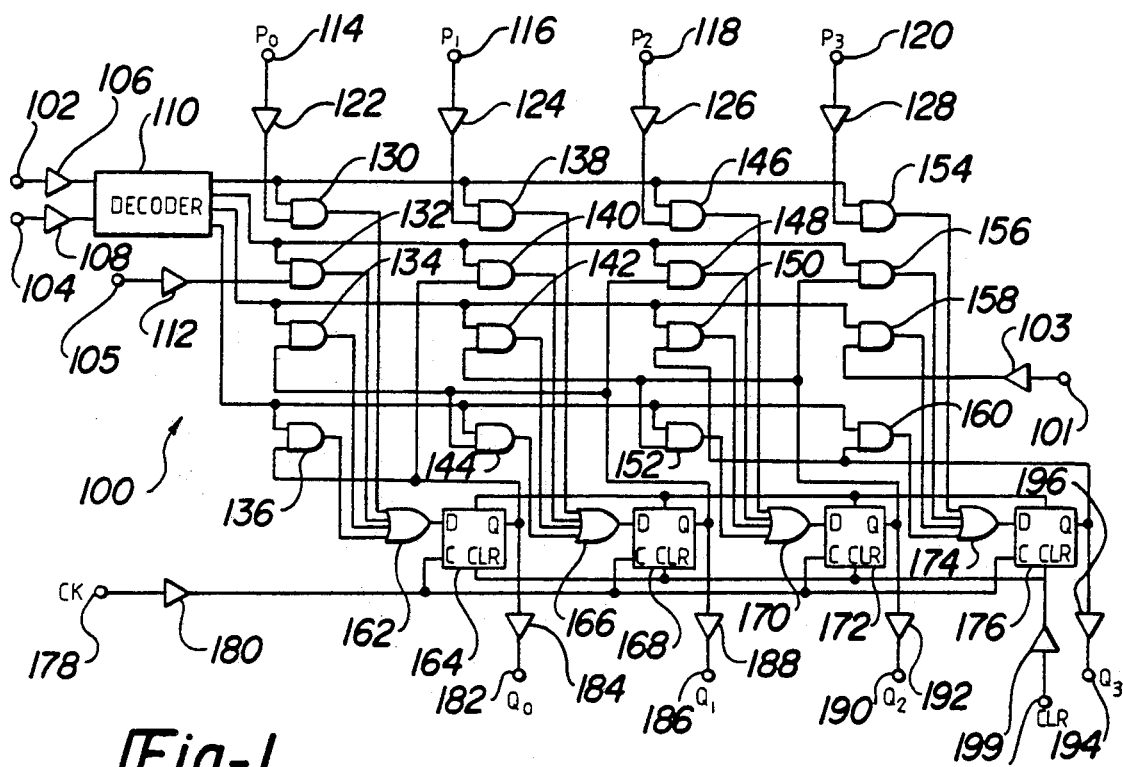
FIG. 1 is a logic diagram of a prior art universal shift register demonstrating the use of logic gates for implementing the various shift register operating modes.

An example of a prior art universal shift register device is set forth in the logic diagram of FIG. 1. One of four possible operating modes is selected by presenting an appropriate two-bit binary code to inputs 102 and 104 which are coupled via buffers 106 and 108, respectively, to first and second inputs of decoder logic 110. Parallel input information to the shift register is presented at leads 114, 116, 118, and 120 via input buffers 122, 124, 126 and 128, respectively. An array of logic AND gates 130 through 160 then is coupled between the four outputs of decoder logic 110 and the register stage flip-flops 164, 168, 172 and 176. The register stage outputs are then taken from the Q outputs of the respective register stage flip-flops and coupled via suitable output buffers 184, 188, 192 and 196 to respective outputs 182, 186, 190 and 194.

The shift register of FIG. 1 provides for conventional operating modes—parallel data entry, shift-right, shift-left, and hold. Serial data to be entered into the shift register during a shift-right operation is presented at input 105 and input buffer 112, while serial data to be input for a shift-left operation is input via lead 101 and input buffer 103. The register may be cleared via a positive-going transition logic signal at lead 198 via input buffer 199 to the CLR inputs of the respective register stages. The register is clocked in a conventional manner via a positive-going transition at input 178 via input buffer 180 to the clock or C inputs of the respective register stage flip-flops.

From an inspection of a typical path through which an information bit must travel in a typical shifting operation of the conventional prior art shift register of FIG. 1, it will be apparent that effecting the shifting process requires an information bit to travel a critical path involving at least two logic gates (plus any required input gating for getting a bit of information into the register in the first place). Hence, this conventional approach leads to increased propagation delay due to the logic gate implementation of the operating modes.

Figure 2:
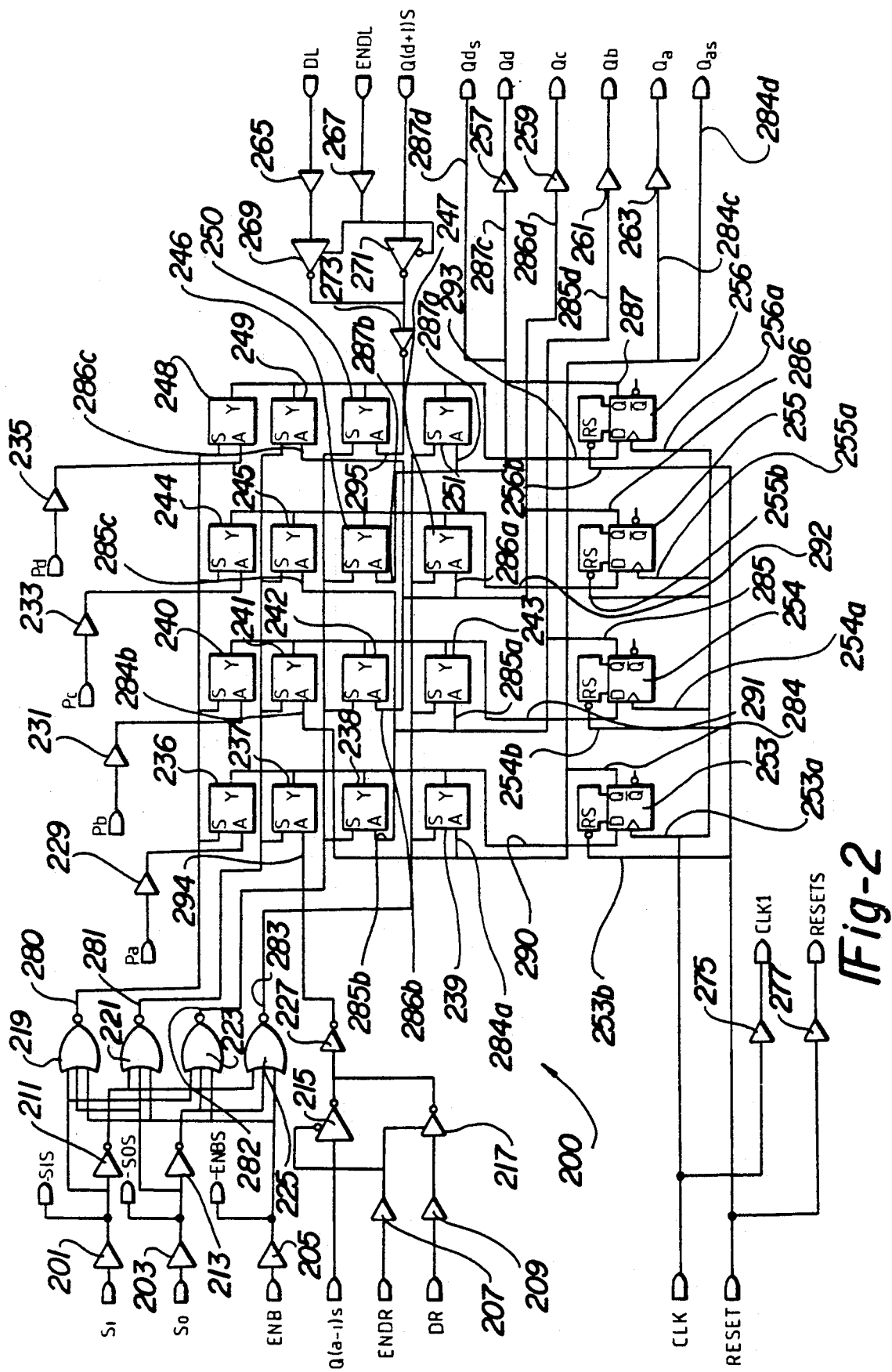
FIG. 2 is a logic block diagram setting forth a universal shift register module comprised of four stages and designed in accordance with the principles of the invention.

A four-bit "slice" or module of an integrated circuit implementation of a universal shift register of the invention is set forth in the logic diagram of FIG. 2. As with the prior art shift register depicted in FIG. 1, the four-bit universal shift register module of FIG. 2 features four operating modes—parallel input, shift-right, shift-left, and data hold. However, unlike the prior art approach, the various operating modes of the shift register of FIG. 2 are implemented using an array of high speed transmission gates. This approach decreases propagation delay by requiring only a single transmission gate in the critical path of an information bit being manipulated. Additionally, the required component and interconnection layouts for an integrated circuit implementation are greatly simplified.

Operating mode selection inputs S1 and S0 are coupled respectively to input buffers 201 and 203. Input buffer 201 is coupled respectively to the inputs of inverter gate 211 and to supplementary output S1S. Input buffer 203 is coupled respectively to the inputs of inverter gate 213 and to supplementary output S0S. Outputs S1S and S0S, as will be explained in a later section, are utilized for cascading a plurality of slices or modules similar to that set forth in FIG. 2 to form shift registers of longer length.

Register enable input ENB is coupled via input buffer 205 to a first input of NOR gates 219, 221, 223 and 225 and to a supplementary enable input ENBS for use in cascading. The output of inverter gate 211 is coupled to second inputs of NOR gate 221 and NOR gate 225, while the output of inverter gate 213 is coupled to a second input of NOR gate 223 and to a third input of NOR gate 225. The output of input buffer 201 is coupled directly to a second input of NOR gate 219 and to a third input of NOR gate 223, while the output of input buffer 203 is directly coupled to inputs of NOR gates 219 and 221. With the arrangement shown, NOR gates 219, 221, 223, and 225, along with inverters 211 and 213, provide a binary of one-of-four decoder for indicating which one of the four operating modes is to be selected.

The output 280 of NOR gate 219, which indicates that a parallel data input function is to be performed, is coupled to the S inputs of transmissions gates 236, 240, 244, and 248 in row 1 of a four row by four column matrix of transmission gates. As will be explained in a later section with reference of FIG. 3, each of the gates in the matrix pass data presented at input A to output Y whenever a logic high or one signal is presented at control input S.

The output 281 of NOR gate 221, which indicates a shift-right function, is coupled to the S inputs of transmission gates 237, 241, 245 and 249 in row 2 of the matrix. The output 282 of NOR gate 223, which indicates a shift-left function, is coupled to the S inputs of transmission gates 238, 242, 246 and 250 in row 3 of the matrix. Similarly, the output 283 of NOR gate 225, which indicates a hold function, is coupled to the S inputs of transmission gates 239, 243, 247 and 251 in row 4 of the matrix.

Parallel input data is presented at inputs $P_a$, $P_b$, $P_c$ and $P_d$, and thence via respective input buffers 229, 231, 233 and 235 to the A input of transmission gates 236, 240, 244 and 248, respectively. The Y outputs of gates 236, 240, 244 and 248 are respectively coupled to the D inputs 290, 291, 292, and 293 of shift register stage D-type flip-flops 253, 254, 255 and 256.

Serial data to be shifted into the left-most register stage in a shift-right operation is presented either at the DR input or the $Q_{(a-1)s}$ input. The latter input is used where the register slice shown is in the middle of a chain of cascaded slices. Input DR passes via input buffer 209 to an input of tri-state buffer 217. Input $Q_{(a-1)s}$ is coupled to an input of tri-state buffer 215. Buffers 215 and 217 are enabled by a logic signal appearing at input ENDR which is coupled via buffer 207 to enabling inputs to tri-state buffers 215 and 217. The outputs of buffers 215 and 217 are commonly coupled to an input of inverter 227, whose output is coupled to the A input 294 of transmission gate 237.

The Y output of transmission gate 237 is coupled to the D input 290 of register stage flip-flop 253. The Q output 284 of flip-flop 253 is coupled to the A input 284b of transmission gate 241 whose Y output is coupled to the D input 291 of the second register flip-flop stage 254. The Q output 285 of flip-flop 254 is coupled to the A input 285c of gate 245 whose output Y is coupled in turn to the D input 292 to the third register stage flip-flop 255. The Q output 286 of register stage 255 is coupled to the A input 286c of transmission gate 249 whose Y output is coupled to the D input 293 of register stage 256.

Serial input data for a shift-left operation is presented to the register slice of FIG. 2 at either input DL or input $Q_{(d+1)s}$, which is used in the case where the slice shown is in the middle of a cascaded chain of register units. Input DL is coupled to an input of tri-state buffer 269 via input buffer 265, while input $Q_{(d+1s)}$ is coupled to an input of tri-state buffer 271. Buffers 269 and 271 are enabled via a logic signal at input ENDL which is coupled to enabling inputs or buffers 269 and 271 via an input buffer 267. The outputs of tri-state buffers 269 and 271 are commonly coupled to an input of inverter 273, whose output is coupled to the A input 295 of transmission gate 250.

The Y output of transmission gate 250 is coupled to the D input 293 of register flip-flop 256 whose Q output 287 is coupled to the A input 287b of transmission gate 246. The Y output of transmission gate 246 is coupled to the D input 292 of register flip-flop 255 whose Q output 286 is coupled to the A input 286b of transmission gate 242. The Y output of transmission gate 242 is coupled to the D input 291 of register flip-flop 254, whose Q output 285 is coupled to the A input 285b to register stage 238. The Y output of transmission gate 238 is coupled to the D input 290 of register stage 253.

To implement the hold function, the A input 284a of transmission gate 239 is coupled to the Q output 284 of register flip-flop 253 and the Y output of gate 239 is coupled to the D input 290 of flip-flop 253. The A input 285a of transmission gate 243 is coupled to the Q output 285 of register flip-flop 254, while the Y output of gate 243 is coupled to the D input 291 of flip-flop 254. The A input 286a of transmission 247 is coupled to the Q output 286 of register flip-flop 255, and the Y output of gate 247 is coupled to the D input 292 of flip-flop 255. Similarly, the A input 287a of gate 251 is coupled to the Q output 287 of register flip-flop 256 and the Y output of gate 251 is coupled to the D input 293 of flip-flop 256.

The shift register is driven from a positive-going clock pulse at input CLK which is coupled to the clock inputs 253a, 254a, 255a, and 256a of the four register stage flip-flops 253, 254, 255 and 256 respectively. Additionally, input CLK is coupled via buffer 275 to the CLK1 output which is used for cascading stages.

The register may be set or reset to all zeros via an appropriate logic low signal appearing at the RESET input which is coupled to the RS inputs 253b, 254b, 255b, and 256b of register flip-flops 253, 254, 255 and 256, respectively. The RESET input is also coupled via buffer 277 to the RESETS output for use in cascading of register modules.

The first register stage output terminal is taken from the Q output 284 of flip-flop 253 which is coupled directly to a supplemental output $Q_{as}$ at 284d, and by buffer 263 at 284c to output $Q_a$. Output $Q_{as}$ is used in a cascading arrangement. The second stage output for the shift register is taken from the Q output 285 of flip-flop 254 which is coupled at 285d via output buffer 261 to output $Q_b$. The third stage output is taken from the Q output 286 of flip-flop 255 which is coupled at 286d via buffer 259 to output $Q_c$. The fourth stage register output is taken from the Q output 287 of flip-flop 256 which is coupled at 287c via buffer 257 to output $Q_d$. The Q output 287 of flip-flop 256 is additionally coupled at 287d to output $Q_{ds}$ for use in cascading stages.

With the arrangement set forth in FIG. 2, the four-bit slice can function as an individual four-bit universal shift register or be combined with other indentical units to function as an eight, twelve, sixteen, etc. universal shift register of selectable length. Each four-bit slice contains decoding logic with S0 and S1 as the mode select inputs. A four-by-four matrix or array of high speed transmission gates implement the various modes selected in conjunction with four clocked D-type positive edge triggered flip-flops. Once the operation mode is chosen via the decoding logic, the appropriate transmission gates are closed, passing data to the register flip-flop and then to the register outputs. Hence, the speed of the shift register is mainly determined by the delay of the register stage flip-flop, since only the high speed transmission gate is coupled between the mode select decoder logic and the register stage flip-flop inputs.

To implement the parallel load function, both inputs S0 and S1 are presented with logic low or zero signals along with a logic zero at input ENB. Under this condition, NOR gate 219 will have a logic high or one output at 280, while NOR gates 221, 223 and 225 will remain at the logic zero or low state. This condition, in turn, enables transmission gates 236, 240, 244 and 248 while the remaining transmission gates in the four-by-four array will remain disabled. Hence, data at input $P_a$, $P_b$, $P_c$ and $P_d$ will be gated respectively to flip-flops 253, 254, 255 and 256 upon application of a positive-going transition at the CLK input via transmission gates 236, 240, 244 and 248. The outputs of flip-flops 253, 254, 255 and 256 are respectively then coupled to register outputs $Q_a$, $Q_b$, $Q_c$ $Q_d$.

To implement the shift-right function, a logic zero is presented at input S0 and a logic one is presented at input S1 along with a logic zero and the ENB input. Under this condition, NOR gate 221 will assume a logic one at its output 281 wile NOR gates 219, 223 and 225 will remain in the logic zero condition. A logic one at NOR gate 221 will enable row 2 of the matrix or gates 237, 241, 245 and 249, while the remaining transmission gates in the array will remain disabled. Upon receipt of a positive-going transition at the CLK input, serial data at input DR will be gated to flip-flop 253 via transmission gate 237. Previously held data at the output Q of flip-flop 253 will be gated to flip-flop 254 via transmission gate 241. Previously held data at flip-flop 254 will be gated to flip-flop 255 via transmission gate 245. Previous data held at flip-flop 255 will be gated to flip-flop 256 via gate 249. The previously held data at flip-flop 256 is either discarded or passed to a next succeeding cascaded register module over output lead $Q_{ds}$.

To implement the shift-left function, a logic one is presented at input S0 and a logic zero at input S1 along with a logic zero at input ENB. Under this condition, NOR gate 223 will assume the logic one state at 282 while NOR gates 219, 221, and 225 will remain at logic zero. A logic one at the output of NOR gate 223 will enable the transmission gates in the third row of the matrix—i.e., gates 238, 242, 246 and 250, while the remaining transmission gates in the matrix will be disabled. Upon receipt of a positive-going signal at the CLK input, serial input data on input DL is gated via transmission gate 250 to flip-flop 256. Previously held data at flip-flop 256 is transferred via gate 246 to flip-flop 255. Previously held data at flip-flop 255 is gated via gate 242 to flip-flop 254. Previously held data at flip-flop 254 is transferred via gate 238 to flip-flop 253. Previously held data at flip-flop 253 is either discarded or passed via output $Q_{as}$ to a preceding cascaded register stage.

To implement the hold function, a logic one is placed on both inputs S0 and S1 while the ENB input is held at the logic low condition. Under this condition, NOR gate 225 will assume the high state at 283 while NOR gates 219, 221 and 223 will remain at logic zero. A one at the output of NOR gate 225 will enable the fourth row of transmission gates 239, 243, 247 and 251, while all other transmission gates will remain disabled. Upon receipt of a positive-going signal at the CLK input, the previous data on the register cell flip-flops 253, 254, 255 and 256 are looped back to corresponding D inputs of each flip-flop in the register via gates 239, 243, 247 and 251—i.e., the register data is held in its previous state.

Figure 3:
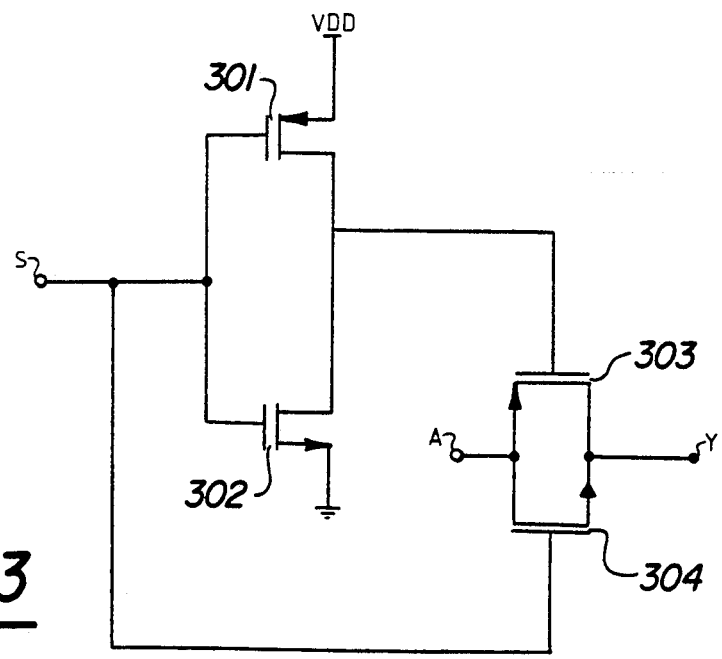
FIG. 3 is a circuit schematic of a transmission gate suitable for use in the matrix of the universal shift register of FIG. 2.

FIG. 3 depicts a transistor level circuit schematic of a transmission gate suitable for use in the array employed in the universal shift register section of FIG. 2. The gate is enabled by a logic high signal being presented to input S whereupon the data bit present at input A will be passed to the gate's output Y. As seen from FIG. 3, input S is commonly coupled to gate electrodes of field effect transistors 301, 302 and 304. The drain electrode of PNP field effect transistor 301 is coupled to bias potential $V_{DD}$ while the drain electrode of transistor 302 is coupled to ground potential. The source electrodes of transistors 301 and 302 are commonly coupled to a gate electrode of field effect transistor 303. The A input is coupled to the drain electrode of transistor 303 and the source electrode of transistor 304, while output Y is coupled to the source electrode of transistor 303 and the drain electrode of transistor 304.

With the arrangement shown in FIG. 3, output Y will assume a logic high state whenever a logic high or one is presented at both the A and S inputs. Output Y will assume the logic low or zero state whenever a logic low is presented at input A in the presence of a logic high signal at the enabling input S. When input S is at logic low, output Y is effectively isolated in high impedance state from input A.

Figure 4:
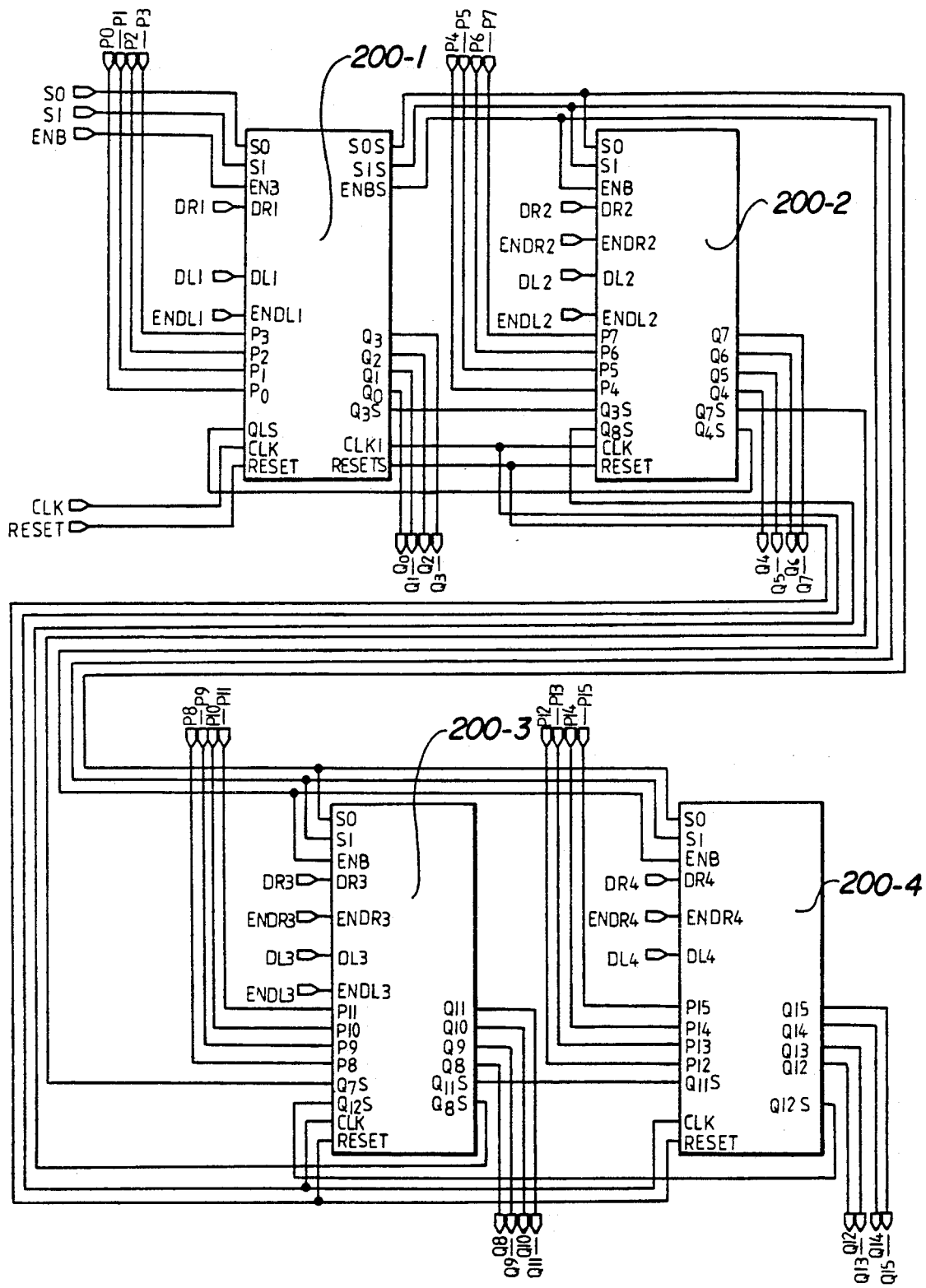
FIG. 4 is an interconnection diagram demonstrating how one or more of the universal shift register units of FIG. 2 may be cascaded to form a shift register of longer length.

As previously mentioned in conjunction with FIG. 2, the four-bit register slice shown therein is capable functioning in a cascaded arrangement with similarly arranged four-bit modules placed at either side of the unit shown in FIG. 2. An example of how four units arranged as in FIG. 2 would be cascaded to form a sixteen-bit universal shift register is set forth in the interconnection diagram of FIG. 4. Each register unit 200-1, 200-2, 200-3 and 200-4 contain the logic arrangement described above with reference to FIG. 2. With the shift register of the invention utilized as each cascaded module, it will be recognized that each four-bit unit may be utilized either by itself or in conjunction with the other three units depending upon which serial data inputs are used in shift-left and shift-right operations. The CLK input pulses are applied to all four stages by coupling the CLK input to the CLK input of module 200-1. The CLK1 output of module 200-1 is then used to drive the CLK inputs of the other three modules. Similarly, the enable input is coupled to the ENB input of the first stage and the ENBC output of the first stage is then used to drive the ENB inputs of the other modules.

The mode selection signal at inputs S0 and S1 is likewise coupled to the S0 and S1 inputs of module 200-1 and the S0S and S1S outputs of the first module are then used to drive the decoder logic of the remaining three units in the cascaded chain.

The fourth register stage of module 200-1 has a supplementary output Q3S coupled to a Q3S input of module 200-2 which functions as an auxiliary shift-right serial data input for module 200-2. In turn, module 200-2 uses a supplementary fourth stage output Q7S which is coupled to the Q7S input of module 200-3 to continue the serial right shifted data path. Module 200-3 has a supplementary fourth stage output Q11S coupled to the Q11S input of the fourth module 200-4.

For left shifted serial data cascaded operation, module 200-4 has a first stage supplemental output Q12S coupled to a Q12S input of module 200-3. Module 200-3, in turn, has a first stage supplemental output Q8S coupled to a Q8S input of module 200-2. Module 200-2 for the shift-left function has a supplemental first stage output Q4S coupled to a Q4S input of the first module 200-1.

The invention has been described in conjunction with a description of an illustrative embodiment, the details of which are given for the sake of example only. The scope and spirit of the invention is to be interpreted in accordance with the appended claims.

What is claimed is:

1. A universal shift register having a plurality M of selectable operating modes where M is an integer, the shift register comprising:
    a plurality N of bistable storage devices where N is an integer, one for each stage of the shift register;
    means for indicating any one of the M selectable operating modes for the shift register; and
    an N column-by-M row matrix of information transmission gates coupled to the indicating means and to the N bistable storage devices, each of the M rows of the matrix arranged to perform one of the selectable register operating modes upon each of the N register stages, whereby register stage data pass through only a single information transmission gate of the matrix while being manipulated between a shift register input and a predetermined shift register stage.

2. A universal shift register having a plurality M of selectable operating modes where M is an integer, the shift register comprising:
    a plurality N of bistable storage devices where N is an integer, one for each stage of the shift register;
    means for indicating any one of the M selectable operating modes for the shift register;
    an N column by M row matrix of information transmission gates coupled to the indicating means and to the N bistable storage devices, and arranged such that each of the M rows of the matrix performs one of the selectable register operating modes upon each of the N register stages, such that register stage data pass through only a single information transmission gate of the matrix while being manipulated between a shift register input and a predetermined shift register stage; and
    means for enabling cascaded connection of the shift register to at least one additional shift register of similar design.

3. A universal shift register having a plurality M of selectable operating modes, the shift register comprising:
    a plurality N of flip-flops, one for each stage of the shift register, M and N being integers;
    decoding logic means coupled for receipt of a variable mode selection signal indicative of any one of the M operating modes and having M output, each assuming a predetermined logic state whenever a corresponding operating mode is indicated by the mode selection signal; and
    a matrix of data transmission gates comprised of M rows and N columns, each transmission gate having a data input, a control input and a data output and operative to pass data presented to the data input to the data output whenever a predetermined signal is presented to the control input, the control inputs of each row of the matrix being commonly coupled to one of the M outputs of the decoding logic means, the data outputs of each column of the matrix being commonly coupled to one of the N flip-flop register stages, and the data inputs being arranged such that a different shift register data manipulation function may be effected by the activation of each different matrix row of transmission gates via the commonly coupled control inputs for each row, whereby register stage data pass through only a single information transmission gate of the matrix while being manipulated between a shift register input and a predetermined shift register stage.

4. The shift register of claim 3 wherein one of the M operating modes comprises a parallel data register input function and wherein one of the M matrix rows corresponding to the parallel input function has each of the data inputs in the one matrix row respectively coupled to one of N external data input lines.

5. The shift register of claim 3 wherein one of the M operating modes comprises a shift-right function and wherein one of the M matrix rows corresponding to the shift-right function has the data input of its transmission gate associated with the first register stage coupled for receipt of external serial data and the data inputs of the remaining gates in the one matrix row coupled to an output of a preceding register flip-flop stage.

6. The shift register of claim 3 wherein one of the M operating modes comprises a shift-left function and wherein one of the M matrix rows corresponding to the shift-left function has the data input of its transmission gate associated with the last register stage coupled for receipt of external serial data and the data inputs of the remaining gates in the one matrix row coupled to an output of a succeeding register flip-flop stage.

7. The shift register of claim 3 wherein one of the M operating modes comprises a hold function and wherein one of the M matrix rows corresponding to the hold function has the data input of each transmission gate in the one matrix row coupled to an output of the corresponding register flip-flop stage associated with the column in which each transmission gate is positioned within the matrix.

8. The shift register of claim 3 further comprising means enabling cascading of the N-stage shift register with at least one additional shift register of similar design.

9. In a universal shift register having a plurality M of selectable operating modes where M is an integer, a plurality N of bistable storage devices where N is an integer, one for each register stage, means for indicating any one of the M operating modes, and means coupled between the bistable storage devices and the means for indicating for effecting any one of the operating modes, the improvement comprising arranging an N column by M row array of high speed data transmission gates to form the means for effecting, each of the M rows of the matrix arranged to perform one of the M selectable operating modes upon each of the N register stages, whereby register stage data pass through only a single information transmission gate of the matrix while being manipulated between a shift register input and a predetermined shift register stage.

* * * * *